United States Patent
Newell et al.

(10) Patent No.: US 12,494,778 B1
(45) Date of Patent: Dec. 9, 2025

(54) DUAL APPLICATION GATE DRIVER

(71) Applicant: Caterpillar Inc., Peoria, IL (US)

(72) Inventors: Zachary W. Newell, Edwards, IL (US); Venkata Ramakrishna Challa, Narasaraopet (IN)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 18/738,420

(22) Filed: Jun. 10, 2024

(51) Int. Cl.
*H03K 17/00* (2006.01)
*H03K 17/567* (2006.01)

(52) U.S. Cl.
CPC .................................. *H03K 17/567* (2013.01)

(58) Field of Classification Search
CPC ........ H02M 1/08; H02M 1/088; H02M 3/158; H02M 1/1584; H02M 7/5387; H01M 7/538; H03K 17/164; H03K 17/567; H03K 17/687; H03K 17/6871
See application file for complete search history.

(56) References Cited

U.S. PATENT DOCUMENTS

| | | | |
|---|---|---|---|
| 7,400,071 B2 * | 7/2008 | Adra | H02K 3/28 |
| | | | 310/68 B |
| 10,340,811 B2 | 7/2019 | Xu et al. | |
| 11,356,013 B2 | 6/2022 | Geske et al. | |
| 11,545,892 B2 | 1/2023 | Hafezinasab et al. | |
| 2009/0225572 A1 * | 9/2009 | Paull | H02M 7/5387 |
| | | | 363/56.01 |
| 2020/0228046 A1 | 7/2020 | White et al. | |
| 2023/0223876 A1 * | 7/2023 | Andris | H02M 7/2195 |
| | | | 322/17 |

FOREIGN PATENT DOCUMENTS

| | | |
|---|---|---|
| DE | 102010003614 A1 | 10/2011 |
| EP | 1650859 B1 | 7/2015 |

OTHER PUBLICATIONS

"Scale™ IGBT and MOSFET Gate Driver Product Overview 2016/2017", www.power.com/igbt-driver, (2016), 52 pgs.
Hexamer Bg et al. "High Performance Switched Reluctance Motor and Power Converter for Implementation in an Electric Vehicle", Article, pp. 3570-3574, publication date: Aug. 9, 1997.

(Continued)

*Primary Examiner* — Tuan T Lam
(74) *Attorney, Agent, or Firm* — Schwegman, Lundberg & Woessner

(57) ABSTRACT

A drive circuit includes a first half bridge gate driver including a first top device and a first bottom device; a second half bridge gate driver including a second top device and a second bottom device; jumper connections and a circuit board. The jumper connections configure the drive circuit as two parallel half bridge gate drivers connected in parallel when jumpers are applied to the jumper connections. The jumpers connect a control gate of the first top device to a control gate of the second top device and connect a control gate of the first bottom device to a control gate of the second bottom device. The circuit board includes the first and second half bridge gate drivers and electrical interconnect to configure the first half bridge gate driver and the second half bridge gate driver as a switched reluctance converter in the absence of the jumpers.

20 Claims, 4 Drawing Sheets

(56) References Cited

OTHER PUBLICATIONS

Texas Instruments. "ISO5852S IGBT Gate Driver Reference Design for Parallel IGBTs With Short-Circuit Protection and External BJT Buffer", Article, pp. 1, 4; figure 2, publication date: Jan. 1, 2016, XP055397741. Retrieved from the Internet: http://www.ti.com/lit/ug/tiduc70a/tiduc70a.pdf.

Written Opinion and International Search Report for Int'l. Patent Appln. No. PCT/US2025/031331, mailed Oct. 6, 2025 (27 pgs).

* cited by examiner

DUAL APPLICATION GATE DRIVER

TECHNICAL FIELD

This document relates to high voltage and current drive circuits for electric motors and electric generators.

BACKGROUND

Powering a large moving non-road work machine (e.g., a wheel loader, a mining truck, etc.) with an electric motor requires a large mobile electric energy source that can provide current of tens to hundreds of Amperes (Amps). Direct current (DC) energy from the energy source is converted to alternating current (AC) energy using power devices (e.g., power field effect transistors, or power FETs) to power the electric motor. The power devices can withstand high voltage and high current, and the converter circuitry can include gate driver circuits to drive the power devices. A generator is another application for high power converters. Different applications can require different converter circuit designs. "Scale IGBT and MOSFET Gate Driver Product Overview," non-patent literature of Power Integrations, relates to a SCALE-2 IGBT and MOSFET gate driver, and refers to using jumpers to configure series or parallel topologies.

SUMMARY OF THE INVENTION

Large electric powered work machines can include high current and voltage electric motors. Electrical circuits for the work machines can include high power converter circuits that convert the DC energy from the energy source to AC energy to power the electric motors of a work machine. High power converters are also used for other applications such as generators for example. High power converter circuits use gate drivers to control switching of the power devices. Different applications may use different converters with different gate driver topologies. It is desirable for a gate driver circuit to be reconfigurable into different circuit topologies for use in different applications.

An example of a drive circuit for an electric motor or generator includes a first half bridge gate driver including a first top device and a first bottom device, a second half bridge gate driver including a second top device and a second bottom device, jumper connections, and a circuit board. The jumper connections configure the drive circuit as two parallel half bridge gate drivers connected in parallel when jumpers are applied to the jumper connections. The jumpers connect a control gate of the first top device to a control gate of the second top device and connect a control gate of the first bottom device to a control gate of the second bottom device. The circuit board includes the first and second half bridge gate drivers and electrical interconnect to configure the first half bridge gate driver and the second half bridge gate driver as a switched reluctance converter in the absence of the jumpers.

An example method of configuring a drive circuit for different applications includes connecting jumpers in the drive circuit to configure the drive circuit as two parallel half bridge gate drivers connected in parallel to a load, wherein each of the parallel half bridge gate drivers includes a top device and a bottom device and the jumpers connect control gates of top devices together and connect control gates of bottom devices together; and omitting the jumpers to configure the drive circuit as a switched reluctance converter including half bridge gate drivers.

DETAILED DESCRIPTION

Examples according to this disclosure are directed to methods and devices for reconfigurable drive circuits for converters used in electric motors generators.

Figure 1:
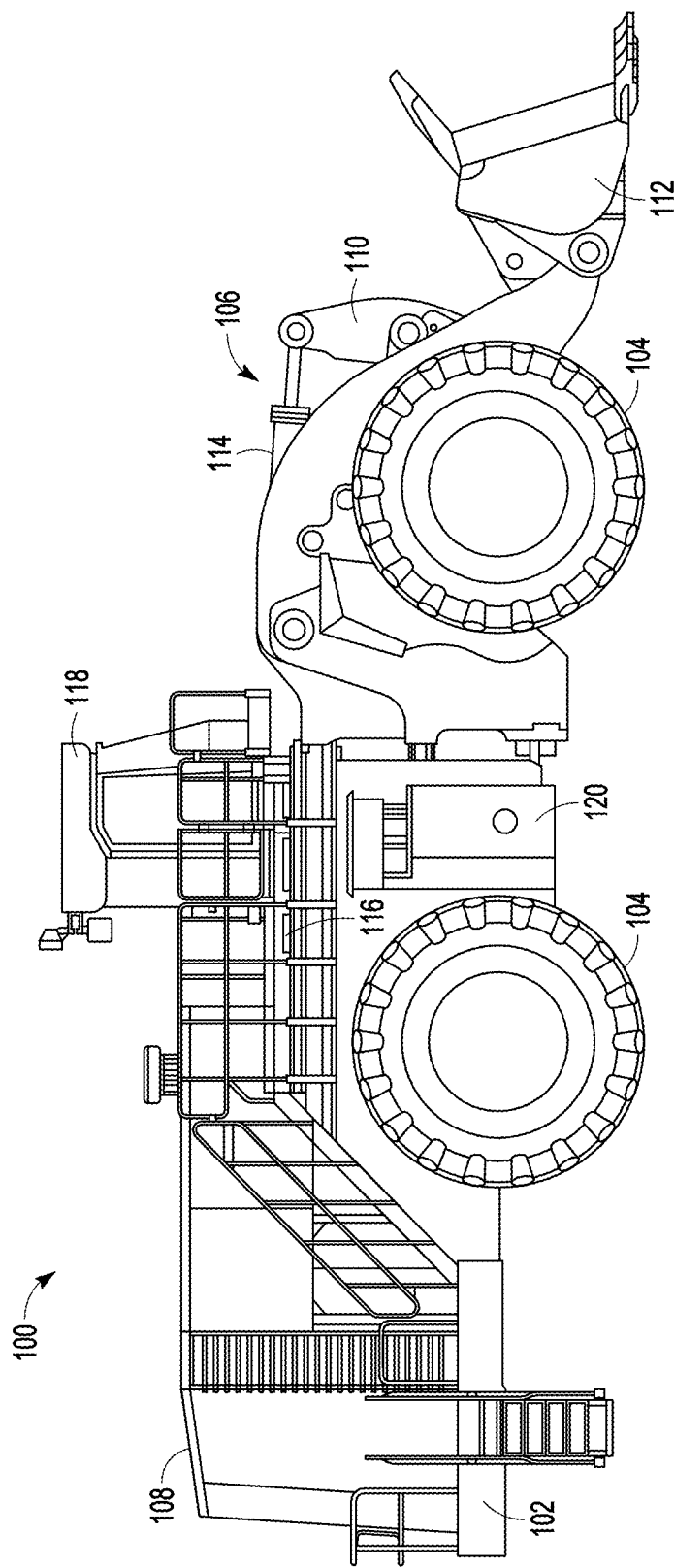
FIG. 1 is an elevation view depicting an example work machine in accordance with this disclosure.

FIG. 1 depicts an example machine 100 in accordance with this disclosure. In FIG. 1, machine 100 includes frame 102, wheels 104, implement 106, and a speed control system implemented in one or more on-board electronic devices like, for example, an electronic control unit or ECU. Example machine 100 is a wheel loader. In other examples, however, the machine may be other types of machines related to various industries, including, as examples, construction, agriculture, forestry, transportation, material handling, waste management, marine, stationary power, and so on. Accordingly, although some examples are described with reference to a wheel loader machine, examples according to this disclosure are also applicable to other types of machines including graders, scrapers, dozers, excavators, compactors, material haulers like dump trucks, marine vessels, locomotives, along with other example machine types.

Machine 100 includes frame 102 mounted on four wheels 104, although, in other examples, the machine could have more than four wheels. Frame 102 is configured to support and/or mount one or more components of machine 100. For example, machine 100 includes enclosure 108 coupled to frame 102. Enclosure 108 can house, among other components, an electric motor to propel the machine over various terrain via wheels 104. In some examples, multiple electric motors are included in multiple enclosures at multiple locations of the machine 100.

Machine 100 includes implement 106 coupled to the frame 102 through linkage assembly 110, which is configured to be actuated to articulate bucket 112 of implement 106. Bucket 112 of implement 106 may be configured to transfer material such as, soil or debris, from one location to another. Linkage assembly 110 can include one or more cylinders 114 configured to be actuated hydraulically or pneumatically, for example, to articulate bucket 112. For example, linkage assembly 110 can be actuated by cylinders 114 to raise and lower and/or rotate bucket 112 relative to frame 102 of machine 100.

Platform 116 is coupled to frame 102 and provides access to various locations on machine 100 for operational and/or maintenance purposes. Machine 100 also includes an operator cabin 118, which can be open or enclosed and may be accessed via platform 116. Operator cabin 118 may include one or more control devices (not shown) such as, a joystick, a steering wheel, pedals, levers, buttons, switches, among other examples. The control devices are configured to enable the operator to control machine 100 and/or the implement 106. Operator cabin 118 may also include an operator interface such as, a display device, a sound source, a light source, or a combination thereof.

Machine 100 can be used in a variety of industrial, construction, commercial or other applications. Machine 100 can be operated by an operator in operator cabin 118. The operator can, for example, drive machine 100 to and from various locations on a work site and can also pick up and deposit loads of material using bucket 112 of implement 106. By further way of example, both operation by a remotely located operator and autonomous or robotic operation are contemplated. Machine 100 can be used to excavate a portion of a work site by actuating cylinders 114 to articulate bucket 112 via linkage assembly 110 to dig into and remove dirt, rock, sand, etc. from a portion of the work site and deposit this load in another location. Machine 100 can include a battery compartment connected to frame 102 and including a battery system 120. Battery system 120 is electrically coupled to the one or more electric motors of the work machine 100.

Figure 2:
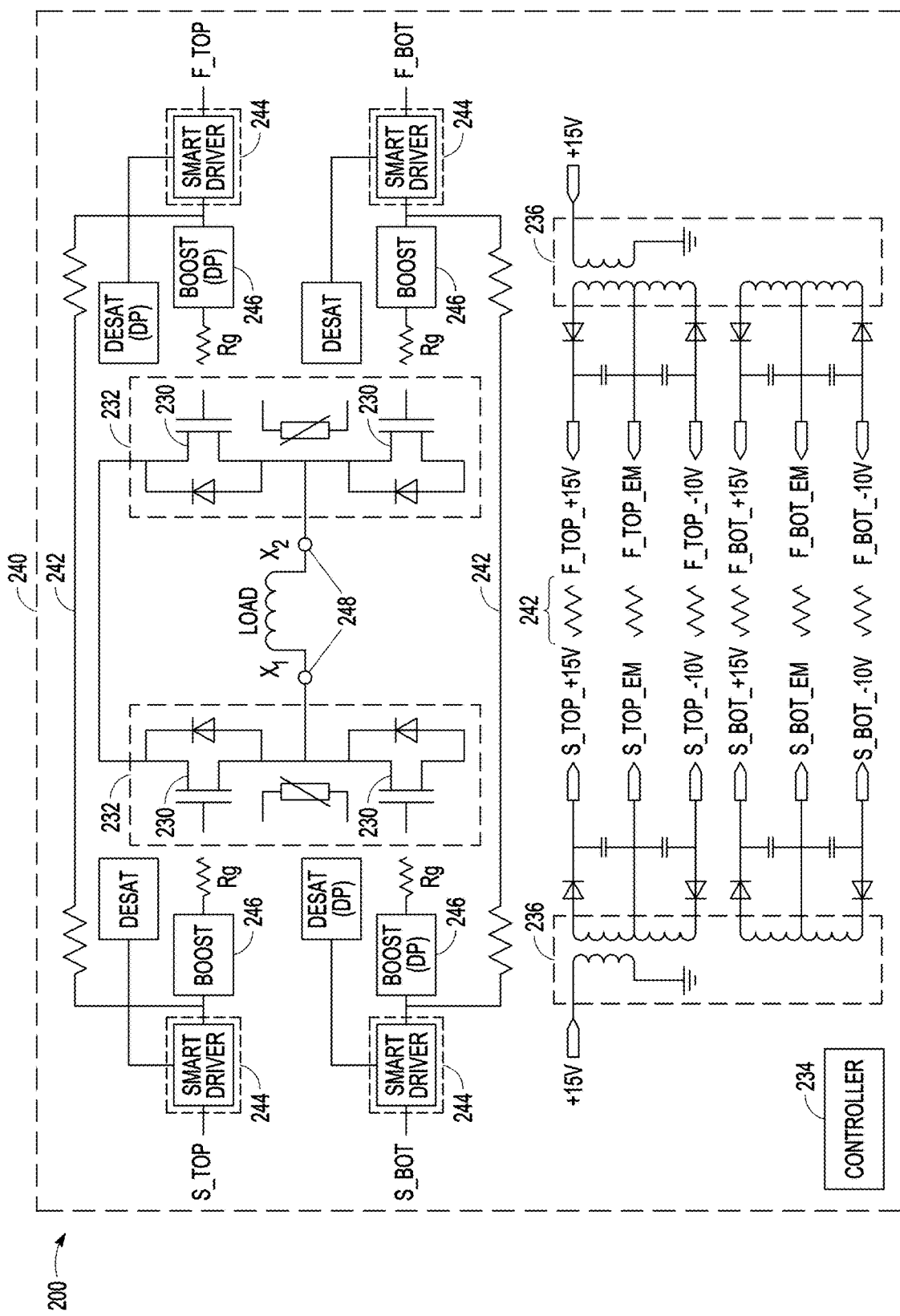
FIG. 2 is a circuit diagram of portions of an example of a reconfigurable driver circuit in accordance with this disclosure.

FIG. 2 is a circuit diagram of the power devices of an example of a driver circuit 200 to drive a load. The driver circuit includes dual half bridge drivers that include power devices. In the example of FIG. 2, the power devices are insulated gate bipolar transistors (IGBTs) 230, and an IGBT half bridge gate driver 232 is connected to each terminal of the LOAD. The LOAD may be a switched reluctance motor. The IGBT half bridge drivers 232 may be included in an inverter used to drive an electric motor of a work machine. A controller circuit 234 provides control signals to activate and deactivate the top and bottom IGBTs to control switching of the IGBTs 230. The IGBTs on the left in FIG. 2 may be the start side top and bottom IGBTs receiving the S_TOP and S_BOT control signals, and the IGBTs on the right side may be the finish side top and bottom IGBTs receiving the F_TOP and F_BOT control signals. The controller circuit 234 may include logic circuitry (e.g., processing circuitry) that includes logic to perform the functions described. The logic circuitry may include a microprocessor, application specific integrated circuit (ASIC), field programmable gate array (FPGA), or other type of processor, interpreting or executing instructions in software or firmware stored in memory. In certain examples, the controller circuit 234 includes a logic sequencer circuit. A logic sequencer refers to a state machine or other circuit that sequentially steps through a fixed series of steps to perform the functions described. A logic sequencer circuit can be implemented using hardware, firmware, or software.

The driver circuit 200 includes multiple voltage domains. The first half bridge gate driver 232 is disposed in a first voltage domain and the second half bridge gate driver 232 is disposed in a second voltage domain. Each of the voltage domains may be referenced to different voltages. The driver circuit 200 includes transformer couplings 236 to couple a circuit supply to the voltage domains. The driver circuit 200 includes smart gate driver circuits 244. The smart gate driver circuits 244 translate control signals from the voltage domain of the controller circuit 234 to the voltage domain of the power devices. The driver circuit 200 of FIG. 2 also includes boost circuits 246 to drive the control gates of the IGBTs. The smart gate driver circuits 244 provide electrical isolation (e.g., using an optocoupler) to send drive signals from the voltage domain of the controller circuit 234 to the boost circuits 246 arranged in the voltage domain of the power devices.

The assembly of the driver circuit 200 includes a circuit board 240. The circuit board 240 includes electrically conductive interconnect (e.g., metal traces) that interconnects the circuits. The interconnect is used to configure the half bridge gate drivers 232 into multiple driver circuit configurations. The driver circuit 200 in FIG. 2 has a switched reluctance converter topology. The LOAD shown in FIG. 2 is a representation, and the LOAD is not included on the circuit board 240. The circuit board 240 includes a first set of load terminals 248 to connect to the LOAD when the half bridge gate drivers 232 are configured in the switched reluctance converter topology. One of the load terminals 248 is connected to a circuit node common to a terminal (e.g., the emitter) of the first top IGBT 230 and a terminal (e.g., the collector) of the first bottom IGBT 230. The other load terminal 248 is connected to circuit node common to a terminal of the second top IGBT 230 and a terminal of the second bottom IGBT 230.

By populating and depopulating different circuits at different locations of the circuit board, the half bridge gate drivers 232 can be configured into a different driver circuit topology. The other circuit topology is two half bridge gate drivers connected in parallel. The circuit board 240 includes jumper connections for jumpers 242 that when present configure the driver circuit as the parallel half bridge gate drivers that utilize switch reluctance IGBT modules in parallel. As shown FIG. 2 the jumpers 242 connect the control gate of the starting side top IGBT to the control gate of the finish side top IGBT, and connect the control gate of the starting side bottom IGBT to the control gate of the finish side bottom IGBT. The jumpers 242 cross the isolation barrier to connect the two voltage domains. The jumpers 242 connect the supply voltages of the two voltage domains together.

Some circuit components are omitted, and some circuit components are added, when the circuit configuration is changed to the parallel half bridge gate drivers. In the parallel half bridge gate drivers configuration, the smart gate driver circuits 244 for two of the IGBTs may be omitted because the top devices are activated together and the bottom devices are activated together.

All four boost circuits 246 may be included in both configurations, and in variations one boost circuit drives the control gates of both of the top devices and one boost circuit drives the control gates of both of the bottom devices in the parallel half bridge configuration. The driver circuit 200 of FIG. 2 also includes desaturation detection (DESAT) circuits to detect desaturation of the IGBTs. In the event of desaturation, the control circuit 234 may initiate a shutdown of the driver circuit 200.

Figure 3:
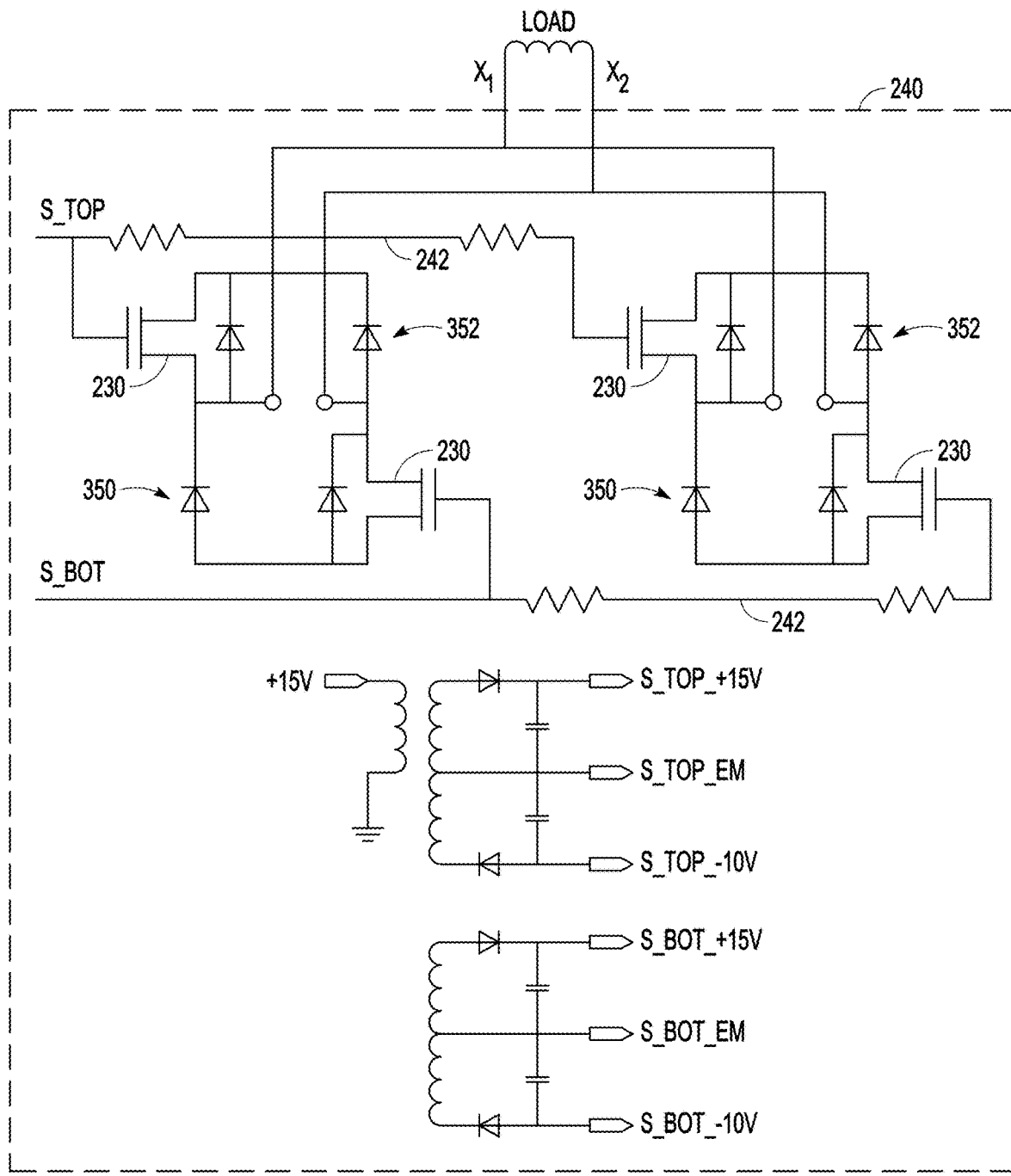
FIG. 3 is a circuit diagram of another example of a reconfigurable driver circuit in accordance with this disclosure.

FIG. 3 is a circuit diagram of an example of a device circuit 300 with the parallel half bridge gate drivers configuration. The jumpers 242 are included in the parallel half bridge gate drivers configuration. One jumper 242 is connected to the S_TOP control signal and connects a control gate of the first top IGBT 230 to a control gate of the second top IGBT 230. The other jumper 242 is connected to the S_BOT control signal and connects a control gate of the first bottom IGBT 230 to a control gate of the second bottom IGBT 230.

The control signals F_TOP and F_BOT are not used in the parallel half bridge gate drivers configuration, and the controller circuit 234 does not provide the F_TOP and F_BOT control signals. In some examples, the same controller circuit 234 is used in both the switched converter configuration in FIG. 2 and the two parallel half bridge gate drivers configuration in FIG. 3. The controller circuit 234 may selectively provide (e.g., according to a state of an input pin of the control circuit 234) control signals to operate the drive circuit as one of the switched reluctance converter configuration or the two parallel half bridge gate drivers configuration.

The circuit board 240 includes a second set of load terminals 250 for the parallel half bridge gate drivers configuration. The second set of load terminals includes one load terminal $X_1$ connected to output terminals (e.g., emitters) of the top IGBTs, and a second load terminal $X_2$ connected to terminals (e.g., collectors) of the bottom IGBTs 230. The circuit board 240 may include electrical interconnect between the terminals of the IGBTs and the load terminals $X_1$, $X_2$. The two parallel half bridge gate drivers configuration of FIG. 3 include diodes 350 connected from the emitters of the top devices to a voltage plane (e.g., a ground plane), and include diodes 352 connected from the collectors of the bottom devices to another voltage plane (e.g., a circuit supply plane). In some examples, the diodes 350 and 352 are omitted and the IGBTS are placed in two half-bridge configurations. The emitters of the top devices are then connected to a load to drive non-switch reluctance applications.

Different applications may use different converters with different gate driver topologies. The gate driver circuits of FIGS. 2 and 3 are reconfigurable as a switched reluctance converter or two parallel half bridge gate drivers for use in different applications. This reduces the cost of having different dedicated assemblies for each application.

INDUSTRIAL APPLICABILITY

Figure 4:
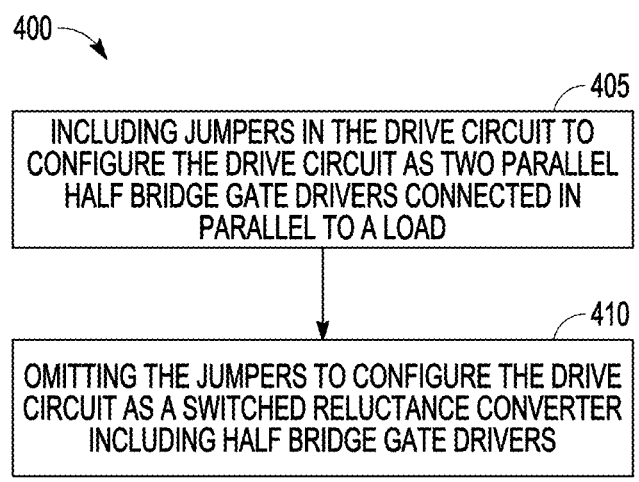
FIG. 4 is a flow diagram of an example of a method of configuring a driver circuit for different applications in accordance with this disclosure.

FIG. 4 is a flow diagram of an example of a method 400 of configuring a drive circuit, such as the drive circuits of FIG. 2 and FIG. 3, to drive the power devices of an inverter for an electric motor or generator of a work machine. The drive circuit is configurable into different circuit topologies.

At block 405, jumpers are included in the drive circuit to configure the drive circuit as two parallel half bridge gate drivers connected in parallel to a load. Each of the half bridge drivers each include a top device (e.g., a top IGBT) and a bottom device (e.g., a bottom IGBT) connected in series. When the jumpers are connected, the control gates of the top devices are connected together, and the control gates of the bottom devices are connected together. When the jumpers are included and the drive circuit is configured as two parallel half bridge gate drivers, the load of the drive circuit is connected to one load terminal that is connected to a circuit node common to output terminals of the top devices (e.g., emitters of top IGBTs) and connected to another load terminal that is connected to a circuit node common to terminals of the bottom devices (e.g., collectors of bottom IGBTs).

At block 410, when the jumpers are omitted, the drive circuit is configured as a switched reluctance converter. When the jumpers are omitted and the drive circuit is configured as a switched reluctance converter, the load of the drive circuit is connected to a first load terminal that is connected to a circuit node common to the top device and the bottom device of one of the half bridge gate drivers (e.g., common to the emitter of the top IGBT and the collector of the bottom IGBT), and to a second load terminal that is connected to a circuit node common to the top device and the bottom device of the other of the half bridge gate drivers.

Each control gate of the four devices may receive a unique control signal from a controller circuit to operate the drive circuit as the switched reluctance converter when the jumpers are omitted. When the jumpers are included and the control gates are connected together, the control circuit provides one control signal to the top devices and a second control signal to the bottom devices. Thus, the controller circuit selectively provides control signals to the control gates of the devices of the drive circuit to selectively operate the drive circuit as the switched reluctance converter, or the two parallel half bridge gate drivers.

In some examples, when the jumpers are included in the drive circuit to configure the drive circuit as two parallel half bridge gate drivers, the jumpers connect a first voltage domain to a second voltage domain using the jumpers. When the jumpers are omitted, the first and second voltage domains are referenced to a different voltage using transformer couplings, and the domains are separated by an isolation barrier. When included, the jumpers provide electrical continuity across the isolation barrier and between the first and second voltage domains. Because the first and second voltage domains are connected by the jumpers, one of the transformer couplings may be omitted when the jumpers are included. Having a base driver circuit assembly that is reconfigurable, allows the driver circuit assembly to be used for different circuit topologies for different applications.

Unless explicitly excluded, the use of the singular to describe a component, structure, or operation does not exclude the use of plural such components, structures, or operations or their equivalents. The use of the terms "a" and "an" and "the" and "at least one" or the term "one or more," and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B" or one or more of A and B") is to be construed to mean one item selected from the listed items (A or B) or any combination of two or more of the listed items (A and B; A, A and B; A, B and B), unless otherwise indicated herein or clearly contradicted by context. Similarly, as used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

The above detailed description is intended to be illustrative, and not restrictive. The scope of the disclosure should, therefore, be determined with references to the appended claims, along with the full scope of equivalents to which such claims are entitled.

What is claimed is:

1. A driver circuit comprising:
   a first half bridge gate driver including a first top device and a first bottom device;
   a second half bridge gate driver including a second top device and a second bottom device;
   jumper connections to configure the driver circuit as two parallel half bridge gate drivers connected in parallel when jumpers are applied to the jumper connections, wherein the jumpers connect a control gate of the first top device to a control gate of the second top device and connect a control gate of the first bottom device to a control gate of the second bottom device when applied to the jumper connections; and
   a circuit board including the first and second half bridge gate drivers and electrically conductive interconnect to configure the first half bridge gate driver and the second half bridge gate driver as a switched reluctance converter when the jumpers are omitted.

2. The driver circuit of claim 1, including:
a first set of load terminals for the two parallel half bridge gate drivers configuration, the first set of load terminals including a load terminal connected to an output terminal of the first top device and an output terminal of the second top device, and another load terminal connected to an output terminal of the first bottom device and an output terminal of the second bottom device; and
a second set of load terminals for the switched reluctance converter configuration, the second set of load terminals including a load terminal connected to a circuit node common to the top device and the bottom device of one of the half bridge gate drivers and another load terminal to a circuit node common to the top device and the bottom device of another of the half bridge gate drivers.

3. The driver circuit of claim 2, including:
insulated gate bipolar transistors (IGBTs) as the first and second top devices and the first and second bottom devices;
wherein the first set of load terminals include one load terminal connected to emitters of the first top device and the second top device, and another load terminal connected to collectors of the first bottom device and the second bottom device; and
wherein the second set of load terminals include one load terminal connected to an emitter of the top device and a collector of the bottom device of one of the half bridge gate drivers, and another load terminal connected to an emitter of the top device and a collector of the bottom device of other of the half bridge gate drivers.

4. The driver circuit of claim 3, wherein the electrically conductive interconnect connects, in the two parallel half bridge gate drivers configuration, a first diode from the emitters of the first and second top devices to a first voltage plane and a second diode from the collectors of the first and second bottom devices to a second voltage plane.

5. The driver circuit of claim 1, including:
a first voltage domain, wherein the half bridge gate driver is disposed in the first voltage domain;
a second voltage domain referenced to a different voltage than the first voltage domain, wherein the second half bridge gate driver is disposed in the second voltage domain;
an isolation barrier between the first voltage domain and the second voltage domain; and
wherein the jumpers eliminate isolation between the first voltage domain and the second voltage domain.

6. The driver circuit of claim 1, including:
a first voltage domain, wherein the first half bridge gate driver is disposed in the first voltage domain;
a second voltage domain referenced to a different voltage than the first voltage domain, wherein the second half bridge gate driver is disposed in the second voltage domain;
an isolation barrier between the first voltage domain and the second voltage domain; and
further including, when configured without the jumpers as the switched reluctance converter, a first transformer coupling between a circuit supply and the first voltage domain, and a second transformer coupling between the circuit supply and the second voltage domain.

7. The driver circuit of claim 1, further including, when configured without the jumpers as the switched reluctance converter, smart gate drivers connected to the control gates of all the top devices and all the bottom devices.

8. The driver circuit of claim 1, including a controller circuit configured to provide control signals to selectively operate the driver circuit as one of the switched reluctance converter or the two parallel half bridge gate drivers.

9. A method of configuring a drive circuit, the method comprising:
including jumpers in the drive circuit to configure the drive circuit as two parallel half bridge gate drivers connected in parallel to a load, wherein each of the parallel half bridge gate drivers includes a top device and a bottom device and the jumpers connect control gates of top devices together and connect control gates of bottom devices together; and
omitting the jumpers to configure the drive circuit as a switched reluctance converter including half bridge gate drivers.

10. The method of claim 9, including:
connecting, in the two parallel half bridge gate drivers configuration, a load terminal to a circuit node common to output terminals of the top devices and connecting another load terminal to a circuit node common to output terminals of the bottom devices; and
connecting, in the switched reluctance converter configuration, a load terminal to a circuit node common to the top device and the bottom device of one of the two parallel half bridge gate drivers and another load terminal to a circuit node common to the top device and the bottom device of another of the two parallel half bridge gate drivers.

11. The method of claim 9, including:
connecting, in the two parallel half bridge gate drivers configuration, a first load terminal to a first circuit node that is common to emitters of insulated gate bipolar transistors (IGBTs) that are the top devices and connecting a second load terminal to a second circuit node that is common to collectors of IGBTs that are the bottom devices; and
connecting, in the switched reluctance converter configuration, a first load terminal to a first circuit node that is common to a top IGBT and a bottom IGBT of one of the two parallel half bridge gate drivers, and connecting a second load terminal to a second circuit node that is common to a top IGBT and a bottom IGBT of a second of the parallel half bridge gate drivers.

12. The method of claim 11, including:
connecting, in the two parallel half bridge gate drivers configuration, a diode from the emitters of the first and second top devices to a first voltage plane and a second diode from the collectors of the first and second bottom devices to a second voltage plane.

13. The method of claim 9, wherein the including the jumpers includes connecting a first voltage domain to a second voltage domain using the jumpers, wherein the first and second voltage domains are separated by an isolation barrier; and eliminating isolation between the first and second voltage domains using the jumpers.

14. The method of claim 13, including omitting a transformer interface for one of the first or second voltage domains included in the switched reluctance converter configuration when including the jumpers to configure the drive circuit as the two parallel half bridge gate drivers.

15. The method of claim 9, including connecting smart gate drivers to the control gates of all the top devices and all the bottom devices when omitting the jumpers to configure the drive circuit as the switched reluctance converter.

16. The method of claim 9, including selectively providing control signals from a controller circuit to the control gates of the top devices and the bottom devices to selectively operate the drive circuit as one of the switched reluctance converter or the two parallel half bridge gate drivers.

17. A circuit board assembly with a configurable gate driver circuit, the assembly comprising:
   a first half bridge gate driver including a first top insulated gate bipolar transistor (IGBT) and a first bottom IGBT;
   a second half bridge gate driver including a second top IGBT and a second bottom IGBT;
   jumper connections to configure the first half bridge gate driver and the second half bridge gate driver as two parallel half bridge gate drivers connected in parallel when jumpers are applied to the jumper connections, wherein the jumpers connect a control gate of the first top IGBT to a control gate of the second top IGBT and connect a control gate of the first bottom IGBT to a control gate of the second bottom IGBT; and
   a circuit board including electrical interconnect that connects a first load terminal to emitters of the first and second top IGBTs together and connects a second load terminal to collectors of the first and second bottom IGBTs together when the gate driver circuit is configured as the two parallel half bridge gate drivers; and configures the first half bridge gate driver and the second half bridge gate driver as a switched reluctance converter when the jumpers are omitted.

18. The assembly of claim 17, wherein the circuit board includes electrical interconnect that connects the first load terminal to an emitter of the first top IGBT and a collector of the first bottom IGBT, and connects the second load terminal to an emitter of the first top IGBT and a collector of the first bottom IGBT when the first half bridge gate driver and the second half bridge gate driver are configured as the switched reluctance converter.

19. The assembly of claim 17, including:
   a first voltage domain, wherein the first top IGBT and the first bottom IGBT are disposed in the first voltage domain;
   a second voltage domain referenced to a different voltage than the first voltage domain, wherein the second top IGBT and the second bottom IGBT are disposed in the second voltage domain;
   an isolation barrier between the first voltage domain and the second voltage domain; and
   wherein the jumpers eliminate isolation between the first voltage domain and the second voltage domain.

20. The assembly of claim 17, including a controller circuit configured to provide control signals to selectively operate the driver circuit as one of the switched reluctance converter or the two parallel half bridge gate drivers connected in parallel.

* * * * *